(12) United States Patent
Yoshida (10) Patent No.: US 9,882,572 B2
(45) Date of Patent: Jan. 30, 2018

(54) FIELD DEVICE AND DETECTOR

(71) Applicant: Yokogawa Electric Corporation, Tokyo (JP)

(72) Inventor: Shinnosuke Yoshida, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 15/462,968

(22) Filed: Mar. 20, 2017

(65) Prior Publication Data

US 2017/0279457 A1    Sep. 28, 2017

(30) Foreign Application Priority Data

Mar. 22, 2016 (JP) .................................. 2016-056791
Feb. 3, 2017 (JP) .................................. 2017-018961

(51) Int. Cl.
| | | |
|---|---|---|
| H03M 1/00 | (2006.01) | |
| G01D 3/02 | (2006.01) | |
| G01F 1/32 | (2006.01) | |
| G01F 1/60 | (2006.01) | |
| G01F 1/84 | (2006.01) | |

(52) U.S. Cl.
CPC .............. *H03M 1/001* (2013.01); *G01F 1/32* (2013.01); *G01F 1/60* (2013.01); *G01F 1/8431* (2013.01)

(58) Field of Classification Search
CPC ........ H03M 1/001; G01F 1/8431; G01F 1/60; G01F 1/32
USPC ................... 341/110; 719/328; 702/188, 127
See application file for complete search history.

(56) References Cited

U.S. PATENT DOCUMENTS

| | | | | |
|---|---|---|---|---|
| 8,583,597 B2 * | 11/2013 | Atamna | .............. | G06F 17/3038 707/634 |
| 8,798,930 B2 * | 8/2014 | Wittmer | ............. | G05B 19/0425 702/1 |
| 2005/0071113 A1 * | 3/2005 | Heilig | ...................... | G01D 3/02 702/127 |

(Continued)

FOREIGN PATENT DOCUMENTS

| | | |
|---|---|---|
| DE | 102012223706 A1 | 6/2014 |
| DE | 102014009354 A1 | 12/2015 |
| JP | 10-221132 A | 8/1998 |

OTHER PUBLICATIONS

Communication dated Aug. 28, 2017 from the European Patent Office in counterpart European application No. 17161962.0.

*Primary Examiner* — Jean B Jeanglaude
(74) *Attorney, Agent, or Firm* — Sughrue Mion, PLLC (57) ABSTRACT

A field device includes a detector and a converter communicative to the detector. The detector also may include, but is not limited to, a sensor, an analog-to-digital converter, and a first processor. The sensor may be configured to acquire an analog measurement signal. The analog-to-digital converter may be configured to convert the analog measurement signal to a digital signal. The first processor may be configured to convert the digital signal into a measurement value to generate a digital signal representing at least the measurement value. The converter may be configured to convert the digital signal representing at least the measurement value into an instrumentation signal to output the instrumentation signal. The detector may be configured to transmit the digital signal representing at least the measurement value and the analog measurement signal to the converter.

18 Claims, 4 Drawing Sheets

(56) References Cited

U.S. PATENT DOCUMENTS

| | | | |
|---|---|---|---|
| 2008/0126679 A1* | 5/2008 | Philipps | G11C 16/349 711/103 |
| 2012/0179423 A1* | 7/2012 | Robl | G05B 19/042 702/188 |
| 2013/0239130 A1* | 9/2013 | Atamna | G06F 17/30073 719/328 |

* cited by examiner

FIELD DEVICE AND DETECTOR

BACKGROUND

Technical Field

Disclosure of the present application relates generally to a field device and a detector wherein a detector includes a sensor converts a measurement signal into a physical quantity and transmits the physical quantity as digital data to a converter. Disclosure of the present application also relates to a detector in which a detector includes a sensor converts a measurement signal into a physical quantity and outputs the physical quantity as digital data.

Related Art

Conventionally, in a field device in which a detector includes a sensor and a converter for converting a measurement value into a unified instrumentation signal and outputting the unified instrumentation signal are separate, all electric circuits required for calculation are mounted on the converter side, and the converter performs a process of converting a measurement signal which is analog-transmitted from the detector into a physical quantity, converting the physical quantity into a unified instrumentation signal, and outputting the unified instrumentation signal to the outside.

In recent years, intelligentization of field devices has been in progress, and a field device referred to as a smart sensor that converts a measurement signal into a measurement value which is a physical quantity on the detector side and transmits the obtained measurement value as digital data to the converter is being put to practical use.

Figure 4:
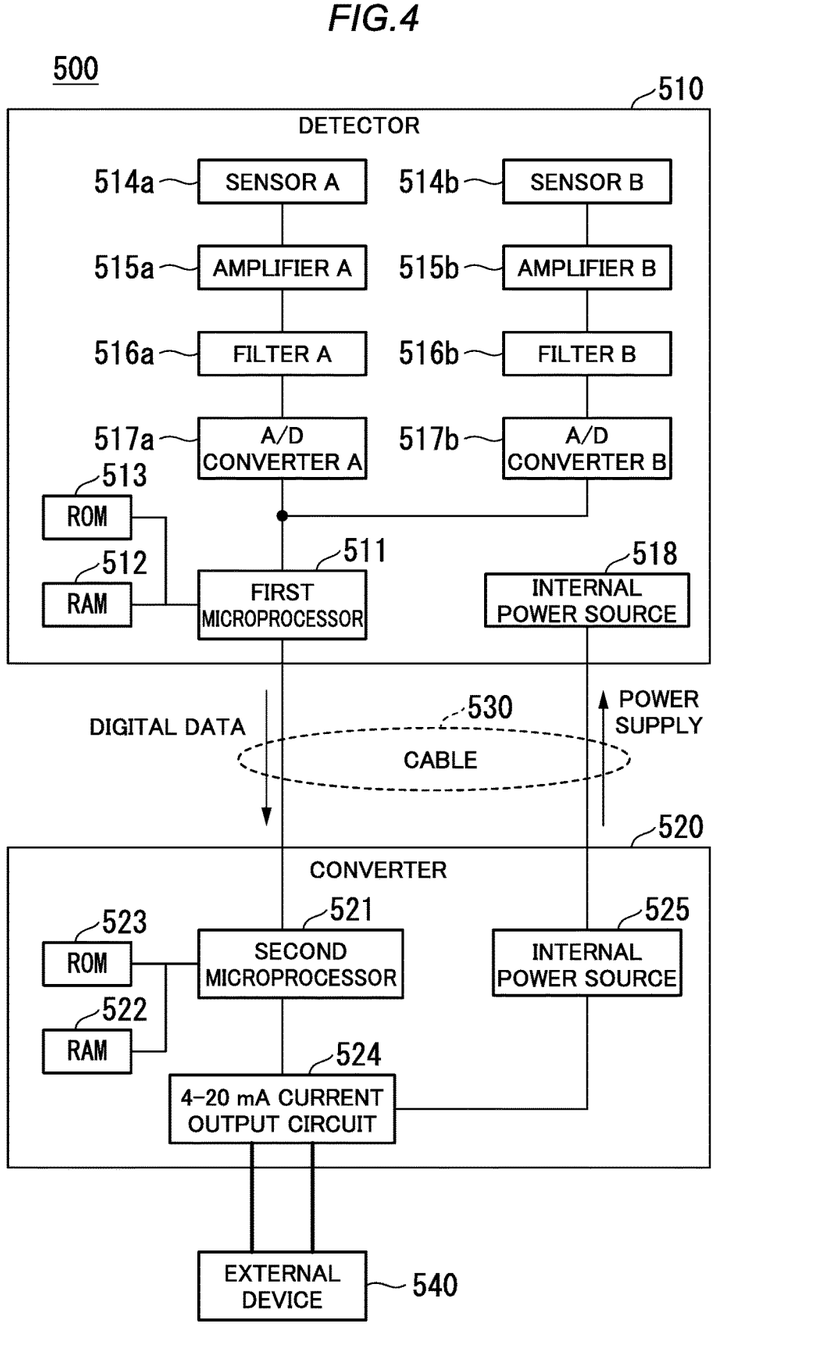
FIG. 4 is a block diagram illustrating a configuration example of a conventional smart sensor.

FIG. 4 is a block diagram illustrating a configuration example of a conventional smart sensor 500. The smart sensor 500 includes a detector 510 and a converter 520, which are connected by a cable 530.

The detector 510 includes a first microprocessor 511, a random access memory (RAM) 512, a read-only memory (ROM) 513, a sensor 514, an amplifier 515, a filter 516, an analog-to-digital (A/D) converter 517, and an internal power source 518. In the example of FIG. 4, measurement systems including a system A and a system B are assumed to be provided, and the sensor 514, the amplifier 515, the filter 516, and the A/D converter 517 are provided in two systems corresponding to the system A and the system B.

In each of the systems, an analog measurement signal acquired by the sensor 514 is amplified by the amplifier 515, a required band is extracted by the filter 516, and then the analog measurement signal is converted into a digital form by the A/D converter 517.

Then, the first microprocessor 511 performs calculation using the RAM 512 and the ROM 513, thereby converting the digital signal into a measurement value which is a physical quantity and outputting the obtained measurement value as digital data to the converter 520 via the cable 530.

The converter 520 includes a second microprocessor 521, a RAM 522, a ROM 523, a 4-20 mA current output circuit 524, and an internal power source 525. The second microprocessor 521 receives the digital data transmitted from the detector 510 and performs predetermined processing on the digital data by using the RAM 522 and the ROM 523. The 4-20 mA current output circuit 524 converts the measurement value into a 4-20 mA direct current which is a unified instrumentation signal and outputs the 4-20 mA direct current to an external device 540.

Power is supplied to the smart sensor 500 from the external device 540 via a signal line that outputs the 4-20 mA direct current. The smart sensor 500 uses the supplied power as the internal power source 525 of the converter 120 and also supplies the power to the internal power source 518 of the detector 510 via the cable 530.

Japanese Unexamined Patent Application, First Publication No. H10-221132 is an example of the above-described related art.

When trouble occurs in the detector 510, there is a need to analyze a measurement signal output from the sensor 514 to find the cause, or the like. Generally, the detector 510 installed on site is often installed in a place that is difficult for an operator to enter or work. Consequently, in such a case, the analysis is performed using the digital data output by the first microprocessor 511.

However, because the digital data output by the first microprocessor 511 is a result of the A/D converter 517 discretizing (digitizing) the measurement signal output from the sensor 514 and the first microprocessor 511 converting the discretized measurement signal into a measurement value which is a physical quantity, the digital data is not necessarily suitable for the analysis of the measurement signal.

Thus, an objective of the present invention is to facilitate analysis of a measurement signal of a sensor in a field device in which a detector includes a sensor converts a measurement signal into a physical quantity and transmits the physical quantity as digital data to a converter. Another objective of the present invention is to facilitate analysis of a measurement signal of a sensor also in a converter in which a detector includes a sensor converts a measurement signal into a physical quantity and outputs the physical quantity as digital data to the outside.

SUMMARY

In embodiments, a field device may include, but is not limited to, a detector and a converter communicative to the detector. The detector also may include, but is not limited to, a sensor, an analog-to-digital converter, and a first processor. The sensor may be configured to acquire an analog measurement signal. The analog-to-digital converter may be configured to convert the analog measurement signal to a digital signal. The first processor may be configured to convert the digital signal into a measurement value to generate a digital signal representing at least the measurement value. The converter may be configured to convert the digital signal representing at least the measurement value into an instrumentation signal to output the instrumentation signal. The detector may be configured to transmit the digital signal representing at least the measurement value and the analog measurement signal to the converter.

In some cases, the converter may include, but is not limited to, a monitoring terminal for measuring the analog measurement signal.

In some cases, the detector may include, but is not limited to, a plurality of sets of the sensor and the analog-to-digital converter associated with the sensor. The detector may be configured to selectively transmit, to the converter, the analog measurement signal from each of the sensors. In this case, the detector may include, but is not limited to a digital-to-analog converter. The digital-to-analog converter may be configured to selectively convert a plurality of the digital signals, from the analog-to-digital converters respectively associated with the sensors, into one or more analog signals. The detector may be configured to transmit, to the converter, the one or more analog signals from the digital-to-analog converter.

In some cases, the converter may be configured to calculate a measurement value from the analog measurement signal transmitted from the detector. The converter may be configured to compare the measurement value calculated from the analog measurement signal with the measurement value from the digital signal representing at least the measurement value. In this case, the converter may be configured to generate an alarm in case that a difference between the measurement value calculated from the analog measurement signal and the measurement value from the digital signal representing at least the measurement value exceeds a predefined threshold. In other cases, the converter is configured to determine soundness of the digital signal by comparing the measurement value calculated from the analog measurement signal with the measurement value from the digital signal representing at least the measurement value.

In some cases, the converter may include, but is not limited to, a second processor configured to analyze the analog measurement signal transmitted from the detector.

In some cases, the converter may include, but is not limited to, a second processor configured to process the digital signal representing at least the measurement value transmitted from the detector. In other causes, the converter may be configured to convert the digital signal representing at least the measurement value, and further include, but is not limited to, an isolation circuit disposed on a previous stage with respect to the second processor.

In some cases, the detector may be configured to transmit, to the converter, the analog measurement signal and the digital signal representing at least the measurement value to cause the converter to receive the analog measurement signal and the digital signal representing at least the measurement value at the same timing.

In some cases, the converter is configured to calculate a measurement value from the analog measurement signal transmitted; and to compare an integrated value of measurement values from the analog measurement signals with an integrated value of the measurement values from the digital signals representing the measurement values.

In other embodiments, a detector may include, but is not limited to, a sensor, an analog-to-digital converter, and a first processor. The sensor may be configured to acquire an analog measurement signal. The analog-to-digital converter may be configured to convert the analog measurement signal to a digital signal. The first processor may be configured to convert the digital signal into a measurement value to generate a digital signal representing at least the measurement value.

In still other embodiments, a method may include, but is not limited to, converting, by a detector, an analog measurement signal to a digital signal; converting, by the detector, the digital signal into a measurement value to generate a digital signal representing at least the measurement value; transmitting the digital signal representing at least the measurement value and the analog measurement signal from the detector to a converter; and converting, by the converter, the digital signal representing at least the measurement value into an instrumentation signal to output the instrumentation signal.

In some cases, the method may further include, but is not limited to, calculating, by the converter, a measurement value from the analog measurement signal transmitted; and comparing, by the converter, the measurement value from the analog measurement signal with the measurement value from the digital signal representing at least the measurement value.

In some cases, the method may further include, but is not limited to, determining, by the converter, soundness of the digital signal based on a result of comparing the measurement value from the analog measurement signal with the measurement value from the digital signal representing at least the measurement value.

In some cases, the method may further include, but is not limited to, receiving, by the converter, the analog measurement signal and the digital signal representing at least the measurement value at the same timing.

In some cases, the method may further include, but is not limited to, calculating, by the converter, a measurement value from the analog measurement signal transmitted; and comparing, by the converter, an integrated value of the measurement values from the analog measurement signals with an integrated value of the measurement values from the digital signals representing the measurement values.

According to some aspects of the present embodiments, a field device including a detector that includes a sensor converts a measurement signal into a physical quantity and transmits the physical quantity as a digital signal to a converter, wherein the measurement signal of the sensor can be easily analyzed.

DESCRIPTION OF EMBODIMENTS

Embodiments of the present invention will be described with reference to the drawings.

First Embodiment

Figure 1:
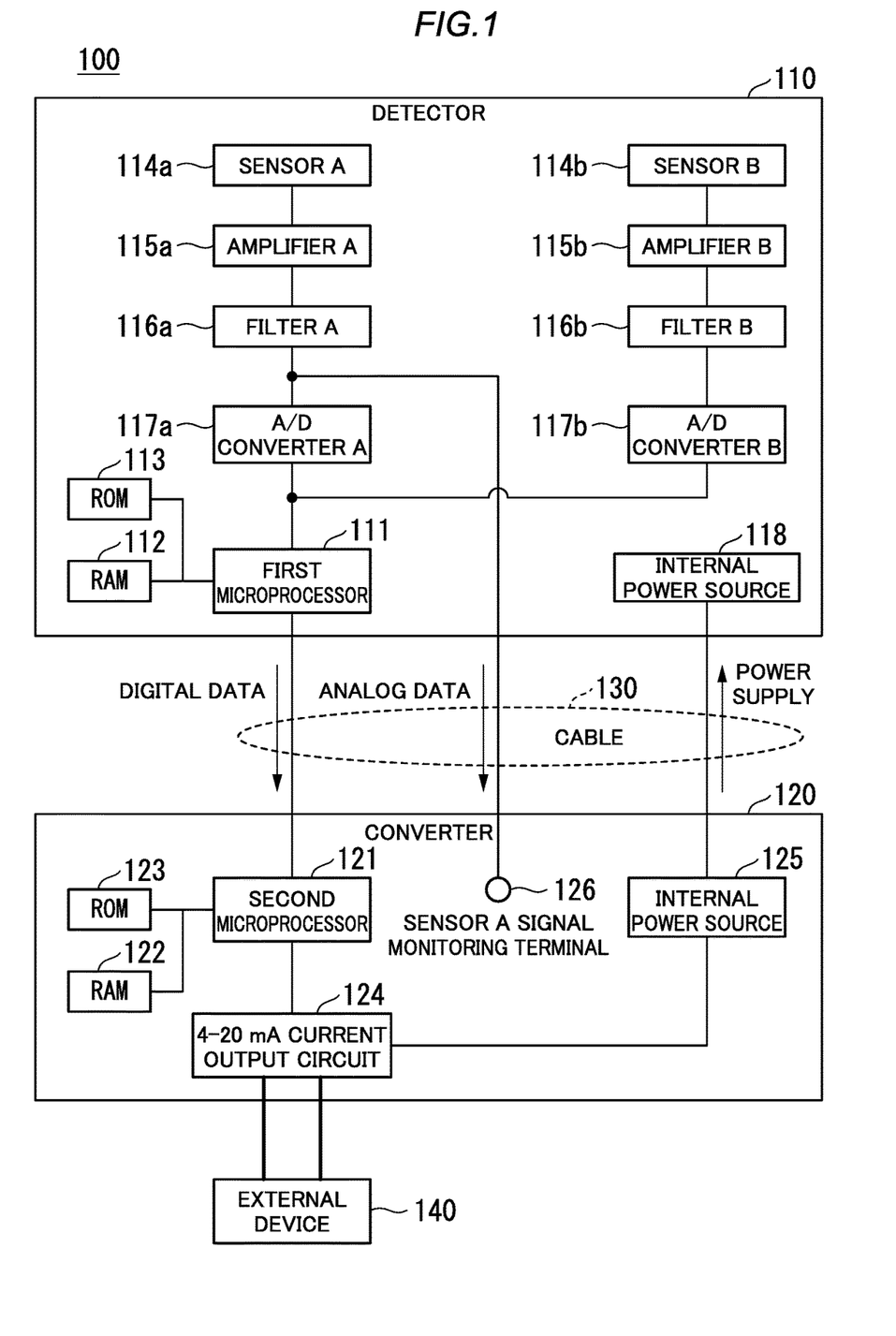
FIG. 1 is a block diagram illustrating a configuration of a smart sensor according to a first embodiment

FIG. 1 is a block diagram illustrating a configuration of a smart sensor 100 according to the present embodiment. The smart sensor 100 includes a detector 110 and a converter 120. The detector 110 and the converter 120 are connected to each other via a cable 130. The smart sensor 100 is constituted in a form in which the detector 110 and the converter 120 are separated. The smart sensor 100 is a field device in which the detector 110 transmits a measurement value as digital data to the converter 120, and may be a vortex flowmeter, an electromagnetic flowmeter, a Coriolis flowmeter, a differential pressure transmitter, or the like. In the present embodiment, the detector 110 and the converter 120 are installed to be spaced apart from each other. Access to the detector 110 is assumed to not be as easy as access to the converter 120.

The detector 110 includes a first microprocessor 111 (first processor), a random access memory (RAM) 112, a read-only memory (ROM) 113, a sensor 114, an amplifier 115, a filter 116, an analog-to-digital (A/D) converter 117, and an internal power source 118. In the example of FIG. 1, the detector 110 includes measurement systems including a system A and a system B. In the detector 110, the sensor 114, the amplifier 115, the filter 116, and the A/D converter 117 are provided in two systems corresponding to the system A and the system B.

In each of the systems, an analog measurement signal acquired by the sensor 114 is amplified by the amplifier 115, a required band is extracted by the filter 116, and then the analog measurement signal is converted into a digital form by the A/D converter 117.

Then, the first microprocessor 111 performs calculation using the RAM 112 and the ROM 113, thereby converting the digital signal into a measurement value which is a physical quantity and outputting the obtained measurement value as digital data to the converter 120 via the cable 130.

The converter 120 includes a second microprocessor 121 (second processor), a RAM 122, a ROM 123, a 4-20 mA current output circuit 124, an internal power source 125, and a sensor A signal monitoring terminal 126.

The second microprocessor 121 receives the digital data transmitted from the detector 110. The second microprocessor 121 performs predetermined processing on the transmitted digital data using the RAM 122 and the ROM 123. The 4-20 mA current output circuit 124 converts the measurement value into a 4-20 mA direct current which is a unified instrumentation signal and outputs the unified instrumentation signal to the external device 140. However, instrumentation signals of other standards may be adopted.

Also, an insulation circuit may be provided in a previous stage with respect to the second microprocessor 121. As the isolation circuit, for example, a capacitor, an insulating transformer, a photo coupler, or the like can be used. In this way, even in a field device that requires the earth (ground) of the detector, a feedback current generated inside the device can be prevented from flowing out to the external earth (ground). Thus, the feedback current inside the device can be accurately controlled, and accuracy of a current output of the 4-20 mA current output circuit 124 can be increased. In addition, noise resistance from both the converter 120 and the detector 110 can be improved.

Power is supplied to the smart sensor 100 from the external device 140 via a signal line that outputs a 4-20 mA direct current. The smart sensor 100 uses the supplied power as the internal power source 125 of the converter 120 and also supplies the power to the internal power source 118 of the detector 110 via the cable 130. A converter of a four-wire field device such as an electromagnetic flowmeter or a Coriolis flowmeter may receive power from a commercial power source.

Further, in the present embodiment, analog data (an analog signal) output from a filter A116*a* of the system A in the detector 110 is transmitted to the converter 120 via the cable 130. Therefore, the cable 130 includes wires of three systems including a digital data system (digital signal system), an analog signal system, and a power supply system.

That is, by being connected to the detector 110 by a signal line for digital communication, the converter 120 can acquire a numerical value by digital data obtained by converting a sensor signal. The numerical value may be assumed to be data obtained by converting a physical quantity corresponding to the sensor signal. Further, the converter 120 is connected to the detector 110 via a signal line for at least one analog signal, separate from the above-mentioned signal line for digital communication. The analog signal is for transmitting at least one sensor acquisition signal from the detector 110 to the converter 120. The converter 120 can monitor sensor signals by the analog signal line.

The digital data (digital signal) herein refers to a signal obtained by digitizing a signal, that is processed on the detector 110 and derived from an instantaneous value of a process value or a diagnostic value. The digital signal is, for example, a signal for transmitting such information to the converter 120 by serial communication or parallel communication, or a signal obtained by binarizing (for example, a binary of High or Low) a state such as normality/abnormality of a circuit of the detector 110, and the like. In addition, the digital data is appropriately encoded as necessary and transmitted from the detector 110 to the converter 120 in some cases.

Here, the diagnostic value is a value of a state diagnosis of a sensor A114*a* or a sensor B114*b*. The diagnostic value is a value that serves as a basis for indicating normality or abnormality of the sensor.

Also, the analog signal is a signal that is processed by the detector 110 of various field devices and analogically represents an instantaneous value of a process value or a diagnostic value. An analog signal may be associated with a numerical value represented by a voltage level, for example.

For example, in the case of a vortex flowmeter, the analog signal is a signal itself output from the sensor (a signal after a charge amp (amplifier)). Alternatively, the analog signal is a signal passed (filtered) only through a band in which a sensor signal is present. Alternatively, the analog signal is a signal that represents a current value of a frequency indicating a flow rate measured by the vortex flowmeter, such as a pulse signal representing a result of comparison of a sensor signal at a predetermined comparative level after the sensor signal is amplified. Alternatively, the analog signal may be an analog signal related to temperature for correcting the vortex flowmeter (a voltage output from a temperature measurement circuit) or an analog signal related to pressure (a voltage output from a pressure measurement circuit). Further, the above-described various analog signals may be switched in a time division manner and transmitted from the detector 110 to the converter 120.

For example, in the case of an electromagnetic flowmeter, the analog signal is a signal itself output from the sensor (signal after the charge amplifier). Alternatively, the analog signal is a signal passed only through a band in which a sensor signal is present. Alternatively, the analog signal may be an analog signal acquired by a diagnosis circuit (an electrode potential signal, an inter-electrode impedance, a signal related to an exciting current).

For example, in the case of the Coriolis flowmeter or an ultrasonic flowmeter, the analog signal is the signal itself output from the sensor (signal after charge amplifier). Alternatively, the analog signal is a signal passed only through a band in which a sensor signal is present. Alternatively, the analog signal may be an analog signal acquired by the diagnostic circuit.

The analog signal transmitted to the converter 120 can be extracted from the outside of the converter 120 via the sensor A signal monitoring terminal 126. The analog signal may also be received by the second microprocessor 121.

The transmitted analog signal can be regarded as a measurement signal of the sensor because the transmitted analog signal is a result of an amplifier A115*a* amplifying the measurement signal of the sensor A114*a* and the amplified measurement signal passing through the filter A116*a*. Thus, analysis of a measurement signal of the sensor can be facilitated by the analog signal being extracted from the sensor A signal monitoring terminal 126 provided in the converter 120. Also, the operator may perform the analysis by opening a cover of the converter 120, connecting a measurement input unit of an external measurement device to the sensor A signal monitoring terminal 126, and measuring an analog signal.

The analog signal transmitted to the converter 120 can be used for purposes other than analyzing a measurement signal of the sensor. For example, a device that has received an analog signal from the sensor A signal monitoring terminal 126 or the second microprocessor 121 that has received an analog signal may calculate a measurement value on the basis of a measurement signal of the analog signal and compare the measurement value with a measurement value of digital data sent from the detector 110. The converter 120 may be constituted to output an alarm when a difference in the physical quantities converted from signals of a digital signal and an analog signal exceeds a predetermined range (e.g., a tolerance range of 1% and the like). The tolerance range is predetermined on the basis of measurement accuracy and the like, for example. In other words, the second microprocessor 121 outputs an alarm when a difference between a measurement value based on the analog signal and a measurement value based on the digital signal exceeds a predetermined amount. The predetermined amount may be a ratio related to a physical quantity obtained as described above. Also, the predetermined amount may be an absolute value of a physical quantity obtained as described above. As a result, diagnosis can be performed by means of dualized signals (the analog signal and the digital signal) having different techniques in safety instrumentation. That is, reliability of a measurement value can be improved or a detection rate of an abnormal operation of the field device can be improved.

Also, a device that has received an analog signal from the sensor A signal monitoring terminal 126 or the second microprocessor 121 that has received an analog signal may compare a measurement value based on a measurement signal of the analog signal with a measurement value of digital data and determine the soundness of a transmitted digital signal (whether the digital signal is sound). For example, a measurement value indicating a digital signal may include a large error due to external noise, etc. However, by determining the soundness as described above, unsound events such as noise can be detected.

Here, to ensure simultaneity of comparison between the analog signal and the digital signal, an acquisition timing of the digital signal is matched with an acquisition timing of the analog signal at the converter 120. For example, when the digital signal represents data from one calculation cycle before, the analog signal is sampled and stored to also be data from one calculation cycle before. For this, a delay circuit is appropriately provided or a memory for storing data is provided.

Alternatively, the analog signal and the digital signal may also be compared using integrated values during a time in which a calculation cycle is negligible. That is, a period for taking the integrated values is made to be sufficiently longer than the calculation cycle. In this case, the calculation cycle does not need to be adjusted, and the realization means becomes simpler.

When a calculated measurement value does not match a measurement value of transmitted digital data, for example, degradation of the cable 130 may be diagnosed as the cause when the mismatch is permanent, and airborne noise may be diagnosed as the cause when the mismatch is temporary.

Also, periodic noise caused by the surrounding environment such as piping vibration and a commercial power source can be detected by performing frequency analysis through a fast Fourier transform (FFT) or the like on an analog signal input from the sensor A signal monitoring terminal 126. Specifically, for example, this can be realized by performing frequency analysis of an analog signal read from the sensor A signal monitoring terminal 126 by the second microprocessor 121. Also, a behavior of an object to be detected can be sensed by performing various analysis processes other than the frequency analysis.

The present embodiment is not limited to the embodiment described above, and various modifications can be made thereto. For example, although the measurement signal of the sensor of the system A is transmitted as the analog signal to the converter 120 in the above-described embodiment, a measurement signal of a sensor of another system may be transmitted to the converter 120 as an analog signal, and a measurement signal of a sensor may be transmitted as an analog signal to the converter 120 for the entire system.

Second Embodiment

Figure 2:
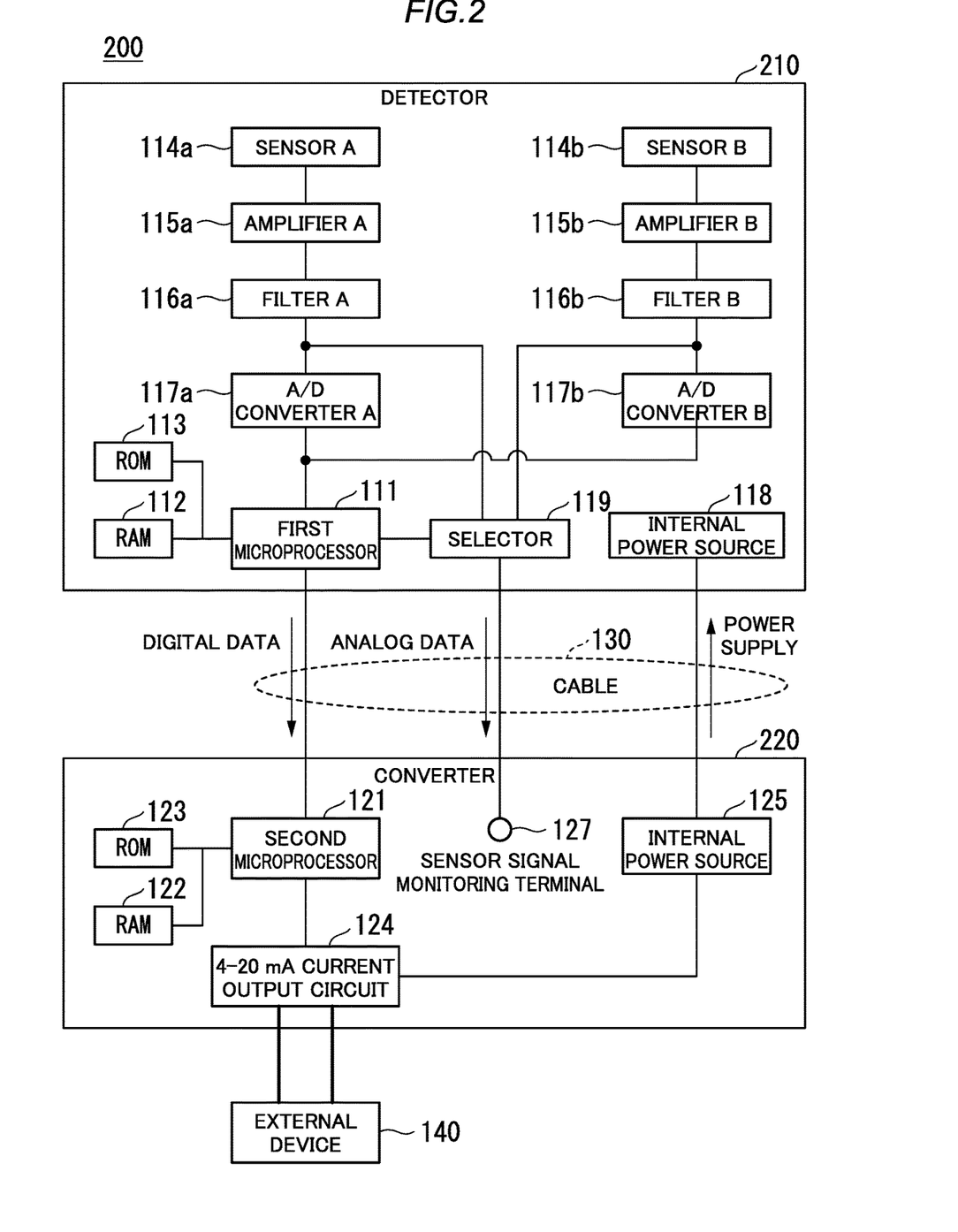
FIG. 2 is a block diagram illustrating a modified example of the smart sensor according to a second embodiment.

FIG. 2 is a block diagram illustrating a configuration of a smart sensor 200 according to the present embodiment. The smart sensor 200 includes a detector 210 and a converter 220, which are connected via the cable 130. As a feature of the present embodiment, the detector 210 includes a selector 119. That is, by having the selector 119, the detector 210 may switch between output data of the filter A116a and output data of a filter B116b and transmit data to a sensor signal monitoring terminal 127 provided in the converter 120.

For the switching operation of the selector 119, the second microprocessor 121 may give a switching instruction to the first microprocessor 111 so that the first microprocessor 111 performs switching control.

Third Embodiment

Figure 3:
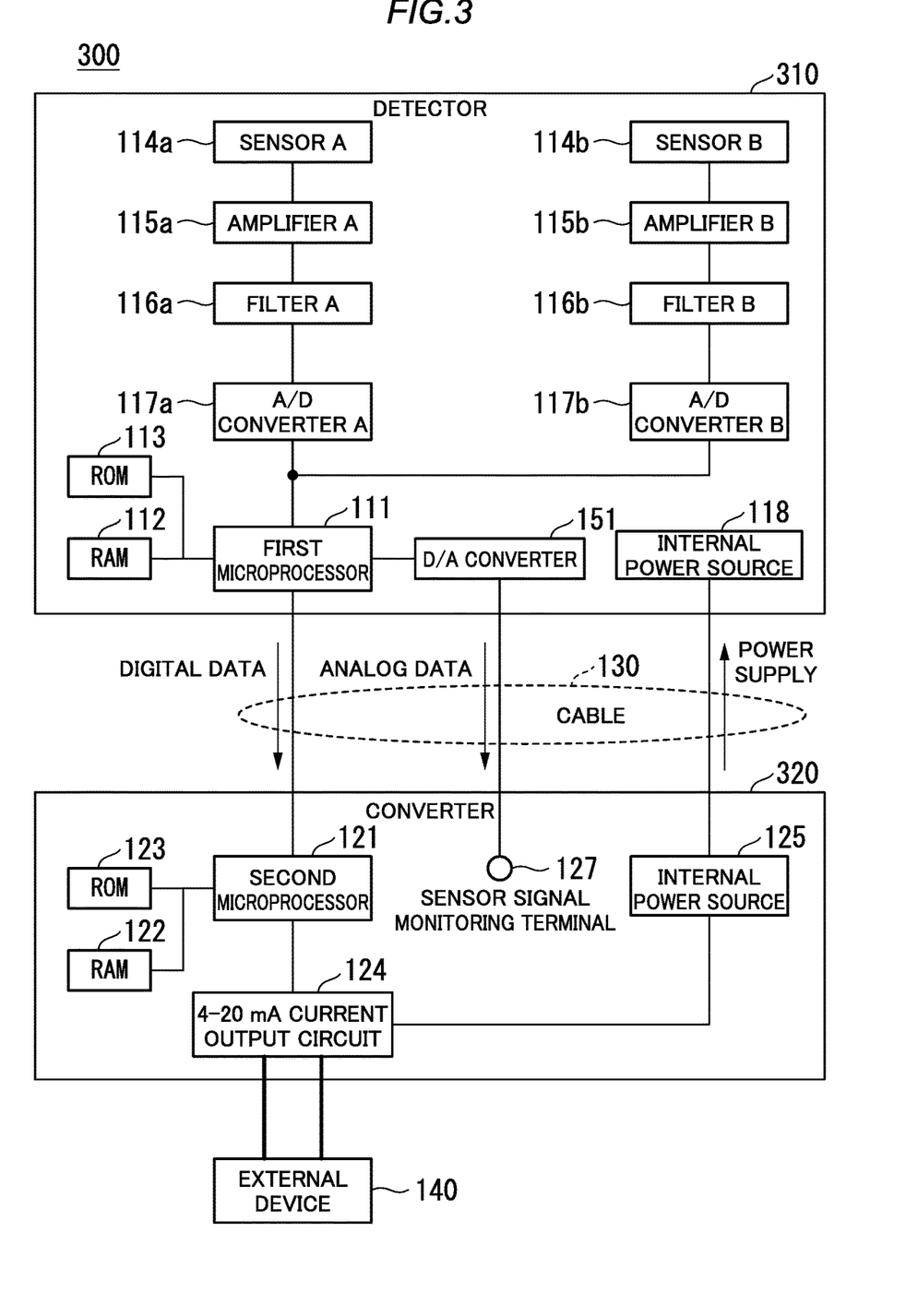
FIG. 3 is a block diagram illustrating a modified example of the smart sensor according to a third embodiment.

FIG. 3 is a block diagram illustrating a configuration of a smart sensor 300 according to the present embodiment. The smart sensor 300 includes a detector 310 and a converter 320, which are connected via the cable 130. In the present embodiment, as illustrated, the first microprocessor 111 selects one of digital sensor measurement signals input from an A/D converter A117a and an A/D converter B117b, converts the selected digital sensor measurement signal into an analog signal by a digital-to-analog (D/A) converter 151, and transmits the analog signal to the sensor signal monitoring terminal 127 provided in the converter 120.

The first to third embodiments have been described above. Also, although two A/D converters are provided in the detectors of FIGS. 1, 2 and 3 (110, 210 and 310, respectively), only one A/D converter may be provided therein, and an analog signal from the filter A116a and the filter B116b may be selectively input using a multiplexer (not illustrated). That is, in this case, the detector transmits a digital signal, which is converted on the basis of any one of a plurality of analog signals, to the converter.

Also, a sensor measurement signal transmitted from the detector 110 (or 210, 310) to the converter 120 (or 220, 320) may be converted into a predetermined general format and transmitted. For example, by converting a sensor measurement signal into a voltage signal of 1-5 V, a general-purpose device for extracting an analog signal from the sensor A signal monitoring terminal 126 and performing analysis of the analog signal can be used.

The functions of the first microprocessor 111 illustrated in FIGS. 1, 2, and 3 are processes based on commands to acquire an A/D conversion value, calculate an A/D conversion value, perform data transmission of the values to the second microprocessor 121 (serial communication or parallel communication), and perform data transmission from the second microprocessor 121 (serial communication or parallel communication). The functions can be realized by an application-specific integrated circuit (ASIC) (gate array) as well as by the microprocessor. When the functions are realized by the ASIC, the ASIC requires to have only the functions listed above. Thus, compared to the case in which the functions are realized by the microprocessor, the amount of memory and peripherals (timers, serial communication, and general input/output (I/O)) being used can be reduced. In this way, the present embodiment or the modified examples thereof can be realized with lower power consumption, lower cost, or smaller area.

Also, although power is supplied from the external device 140 in each of the smart sensors 100, 200, and 300, a modified example thereof may be as follows. That is, in each of the detectors 110, 210, and 310, the internal power source 118 functions as a power source without power being supplied from the converters 120, 220, and 320. In this way, a detector that outputs a signal to an external device may have a configuration that does not require a converter. In other words, the detector in this example includes a sensor for acquiring a measurement signal, an A/D converter for converting an analog signal based on the measurement signal into a digital form, and a first processor for converting the digitally converted measurement signal into a measurement value and outputting the measurement value as a digital signal. The detector outputs the analog signal together with the digital signal to the outside.

Each element for the field device described above can be implemented by hardware with or without software. In some cases, the field device may be implemented by one or more hardware processors and one or more software components wherein the one or more software components are to be executed by the one or more hardware processors to implement each element for the field device. In some other cases, the field device may be implemented by a system of circuits or circuitry configured to perform each operation of each element for the field device.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A field device comprising:
   a detector comprising:
      a sensor configured to acquire an analog measurement signal;
      an analog-to-digital converter configured to convert the analog measurement signal to a digital signal; and
      a first processor configured to convert the digital signal into a measurement value to generate a digital signal representing at least the measurement value; and
   a converter configured to convert the digital signal representing at least the measurement value into a unified instrumentation signal to output the unified instrumentation signal,
   wherein the detector is configured to transmit, to the converter, the digital signal representing at least the measurement value, which was generated by the first processor, together with the analog measurement signal that was acquired by the sensor.

2. The field device according to claim 1, wherein the converter comprises a monitoring terminal for measuring the analog measurement signal.

3. The field device according to claim 1, wherein the detector comprises a plurality of sets of the sensor and the analog-to-digital converter associated with the sensor,
   wherein the detector is configured to selectively transmit, to the converter, the analog measurement signal from each of the sensors.

4. The field device according to claim 3,
   wherein the detector comprises: a digital-to-analog converter configured to selectively convert a plurality of the digital signals, from the analog-to-digital converters respectively associated with the sensors, into one or more analog signals, and
   wherein the detector is configured to transmit, to the converter, the one or more analog signals from the digital-to-analog converter.

5. The field device according to claim 1, wherein the converter is configured to calculate a measurement value from the analog measurement signal transmitted from the detector, the converter is configured to compare the measurement value calculated from the analog measurement signal with the measurement value from the digital signal representing at least the measurement value.

6. The field device according to claim 5, wherein the converter is configured to generate an alarm in case that a difference between the measurement value calculated from the analog measurement signal and the measurement value from the digital signal representing at least the measurement value exceeds a predefined threshold.

7. The field device according to claim 5, wherein the converter is configured to determine soundness of the digital signal by comparing the measurement value calculated from the analog measurement signal with the measurement value from the digital signal representing at least the measurement value.

8. The field device according to claim 1, wherein the converter comprises:
   a second processor configured to analyze the analog measurement signal transmitted from the detector.

9. The field device according to claim 1, wherein the converter comprises:
   a second processor configured to process the digital signal representing at least the measurement value transmitted from the detector.

10. The field device according to claim 9, wherein the converter is configured to convert the digital signal representing at least the measurement value, and comprising: an isolation circuit disposed on a previous stage with respect to the second processor.

11. The field device according to claim 1, wherein the detector is configured to transmit, to the converter, the analog measurement signal and the digital signal representing at least the measurement value to cause the converter to receive the analog measurement signal and the digital signal representing at least the measurement value at the same timing.

12. The field device according to claim 1, wherein the converter is configured to calculate a measurement value from the analog measurement signal transmitted; and to compare an integrated value of measurement values from the analog measurement signals with an integrated value of the measurement values from the digital signals representing the measurement values.

13. A detector comprising:
   a sensor configured to acquire an analog measurement signal;
   an analog-to-digital converter configured to convert the analog measurement signal to a digital signal; and a first processor configured to convert the digital signal into a measurement value to generate a digital signal representing at least the measurement value, to transmit, to a converter, the digital signal representing at least the measurement value, which was generated by the first processor, together with the analog measurement signal that was acquired by the sensor.

14. A method comprising:

converting, by a detector, an analog measurement signal to a digital signal;

converting, by the detector, the digital signal into a measurement value to generate a digital signal representing at least the measurement value;

transmitting, by the detector, the digital signal representing at least the measurement value and the analog measurement signal from the detector to a converter;

converting, by the converter, the digital signal representing at least the measurement value into a unified instrumentation signal to output the unified instrumentation signal; and transmitting, by the converter, to a converter, the digital signal representing at least the measurement value, which was generated by the first processor, together with the analog measurement signal that was acquired by the sensor.

15. The method according to claim 14, further comprising:

calculating, by the converter, a measurement value from the analog measurement signal transmitted; and comparing, by the converter, the measurement value from the analog measurement signal with the measurement value from the digital signal representing at least the measurement value.

16. The method according to claim 15, further comprising:

determining, by the converter, soundness of the digital signal based on a result of comparing the measurement value from the analog measurement signal with the measurement value from the digital signal representing at least the measurement value.

17. The method according to claim 14, further comprising:

receiving, by the converter, the analog measurement signal and the digital signal representing at least the measurement value at the same timing.

18. The method according to claim 14, further comprising:

calculating, by the converter, a measurement value from the analog measurement signal transmitted; and comparing, by the converter, an integrated value of measurement values from the analog measurement signals with an integrated value of the measurement values from the digital signals representing the measurement values.

* * * * *